US 8,881,074 B2

(12) United States Patent
Faes et al.

(10) Patent No.: US 8,881,074 B2
(45) Date of Patent: Nov. 4, 2014

(54) DEVICE AND METHOD FOR REFACTORING HARDWARE CODE

(75) Inventors: Philippe Paul Henri Faes, Ghent (BE); Hendrik Richard Pieter Eeckhaut, Ghent (BE)

(73) Assignee: Sigasi NV, Ghent (BE)

( * ) Notice: Subject to any disclaimer, the term of this patent is extended or adjusted under 35 U.S.C. 154(b) by 195 days.

(21) Appl. No.: 13/123,055

(22) PCT Filed: Oct. 12, 2009

(86) PCT No.: PCT/EP2009/007307
§ 371 (c)(1),
(2), (4) Date: May 16, 2011

(87) PCT Pub. No.: WO2010/040567
PCT Pub. Date: Apr. 15, 2010

(65) Prior Publication Data
US 2011/0209132 A1    Aug. 25, 2011

(30) Foreign Application Priority Data
Oct. 10, 2008    (EP) ..................................... 08166381

(51) Int. Cl.
G06F 17/50    (2006.01)
(52) U.S. Cl.
CPC .................................. G06F 17/5045 (2013.01)
USPC ........... 716/106; 716/101; 716/102; 716/103; 716/104; 716/107
(58) Field of Classification Search
USPC .................................................. 716/100–107
See application file for complete search history.

(56) References Cited

U.S. PATENT DOCUMENTS

| | | | | |
|---|---|---|---|---|
| 6,132,109 A | * | 10/2000 | Gregory et al. | 717/131 |
| 6,907,584 B1 | * | 6/2005 | Milne et al. | 716/102 |
| 7,503,027 B1 | * | 3/2009 | Zhao et al. | 716/104 |
| 2003/0033595 A1 | * | 2/2003 | Takagi et al. | 717/143 |
| 2006/0230366 A1 | | 10/2006 | Baumgartner et al. | |
| 2006/0230367 A1 | | 10/2006 | Baumgartner et al. | |

OTHER PUBLICATIONS

Kaiping Zeng and Sorin A. Huss, RAMS: A VHDL-AMS Code Refactoring Tool Supporting High Level Analog Synthesis, VLSI, 2005. Proceedings., IEEE Computer Society Annual Symposium on Tampa, FL, USA, Piscataway, NJ, May 11-12, 2005, pp. 266-267, XP010798506.
Kaiping Zeng and Sorin A. Huss, "Architecture Refinements by Code Refactoring of Behavioral VHDL-AMS Models", Circuits and Systems, 2006, ISCAS 2006, Proceedings. 2006 IEEE International Symposium on, Piscataway, NJ, USA, May 21, 2006, pp. 1475-1478, XP010938653.

(Continued)

Primary Examiner — Nghia Doan
(74) Attorney, Agent, or Firm — Bacon & Thomas, PLLC (57) ABSTRACT

A tool for rewriting hardware design hardware design language (HDL) code is arranged for receiving HDL code (2) expressing a hardware design of a digital circuit. The tool comprises means (4) for generating a representation (6) of the syntax of the received HDL code, the representation containing a plurality of nodes. The tool further comprises means (3) for determining modifications to the representation of the syntax whereby at least one node is added to or removed from the representation and computation means (9) for generating a modified version (10) of the received HDL code using the received HDL code and modifications to the received HDL code, the modifications determined from the modified representation of the syntax.

10 Claims, 3 Drawing Sheets

(56) References Cited

OTHER PUBLICATIONS

Steven Haynal et al., "A System Verilog Rewriting System for RTL Abstraction with Pentium Case Study", Formal Methods and Models for Co-Design 2008. Memocode 2008. 6th ACM/IEEE International Conference on, IEEE, Piscataway, NJ, USA, pp. 79-88, XP031275118.

International Search Report in PCT/EP2009/007307, Jan. 29, 2010.

* cited by examiner

*entity my_entity is*

*end my_entity;*

*architecture my_arch of my_entity is*

*signal counter : integer range 0 to 1000;*

*component alarm_comp is*

*port (input : in integer);*

*end component alarm_comp;*

*begin*

*count: process is*

*begin*

*wait for 1000ns;*

*if counter < 1000 then*

*counter <= counter + 1;*

*else*

*counter <= 0;*

*end if;*

*end process count;*

*alarm_instantiation: alarm_comp*

*port map (input => counter);*

*end my_arch;*

Fig.1A

Architecture instantiation     Declaration

Other concurrent statements     Use

DEVICE AND METHOD FOR REFACTORING HARDWARE CODE

FIELD OF THE INVENTION

The present invention generally relates to the field of hardware design languages as used in the design of digital electronic circuits. More in particular, it relates to a device for automatically rewriting such hardware code or parts thereof.

BACKGROUND OF THE INVENTION

Figure 1A:
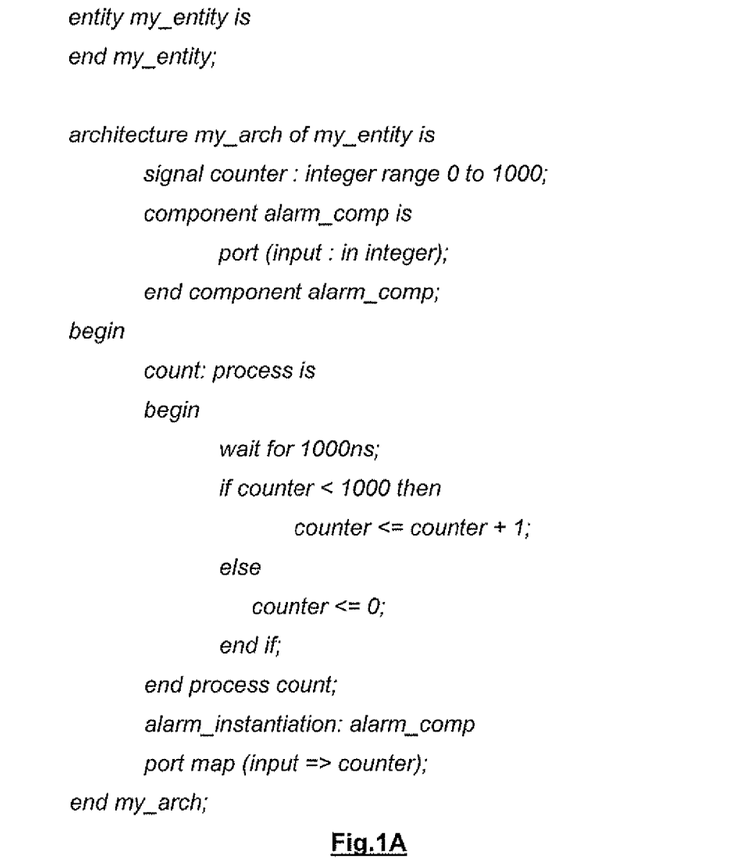
FIGS. 1A and 1B illustrate a portion of VHDL code and a visualisation of its structure.
Figure 1B:
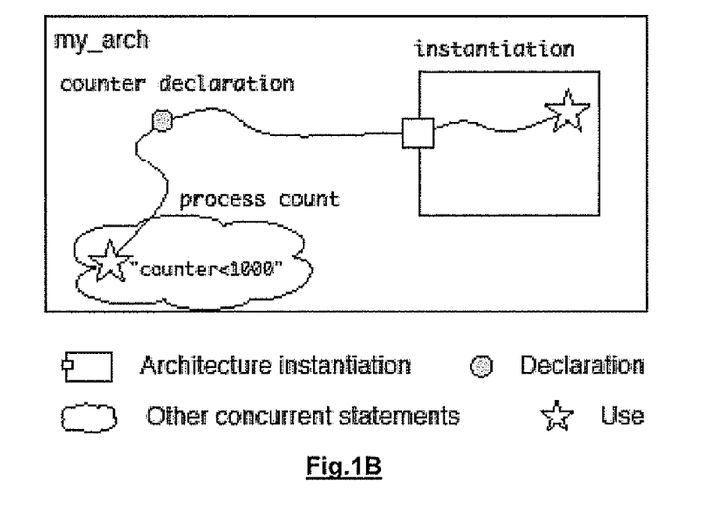

Complex digital electronic components are designed using a Hardware Design Language (HDL), like VHDL, Verilog, SystemC, SystemVerilog and others. A design engineer types the description of a digital circuit in a textual format in a HDL. The HDL code can be simulated on a computer to validate the behaviour. After the behaviour of a digital design is validated, automated tools can translate the HDL design into a netlist, which lists the primitive components such as logical NAND ports or predefined memory blocks, interconnected by wires. Given this netlist as input and using many additional tools, a physical Application Specific Integrated Circuit (ASIC) can be made. Alternatively, the netlist can be programmed into a reconfigurable standard component, such as a Field Programmable Gate Array (FPGA). FIG. 1 provides as an example a portion of VHDL code (FIG. 1A) and a visual representation of its structure (FIG. 1B).

In the process of designing digital hardware, engineers often make modifications that require small changes to many files. Manually applying theses changes is time consuming and error prone.

Some HDLs are very verbose, i.e. they require a lot of text for expressing even simple concepts. Designs expressed in these languages contain a lot of redundant information, which needs to be kept consistent at all times. Again this is time consuming and error prone.

Once a design is near completion, it is very hard (and thus prohibitively expensive) to make drastic architectural changes. This difficulty is partly caused by the need to manually rewrite large portions of the design, which is time consuming and error prone.

For the same reasons, encapsulating and parameterizing legacy code is often prohibitively expensive. Because of this, opportunities for code reuse (and thus cost reduction) are lost.

Code refactoring, i.e. textual modification to program code, exists for software programming languages. The modification improves the internal structure of the code, while preserving the observable behaviour. Throughout the 1990s, most refactoring was done manually, but with the new millennium came robust automated refactoring tools for software languages. Most prominent examples are Eclipse (IBM) and JavaBeans (Sun) for Java and Refactor! (Microsoft) for the .NET languages. Refactoring differs from traditional code rewrite systems in that most of the program text is left unchanged. Traditional rewrite systems read a body of code, process it internally and produce an entire new body of code from the internal representation. Refactorings, on the other hand, produce localized, specific changes to the code. Since they leave the bulk of the code unchanged, a human design engineer can easily determine the scope and correctness of the proposed refactoring. Code refactoring works as a productivity tool in software engineering, as it significantly enhances operations like code review and bug fixing, code reuse and introducing enhancements and new features.

However, tools and methods for software refactoring cannot readily be applied to hardware refactoring, as software programming languages are fundamentally different from HDLs. Software code is translated into machine code, which is then sequentially executed by one or more instruction set processors. On the contrary, HDL code is translated to a netlist (i.e. a description of the connectivity of the electronic design), which is then placed and routed on a physical chip. This chip then contains a few thousand up to hundreds of millions transistors that are interconnected and all work in parallel. HDLs describe a spatial structure and contain an extremely accurate temporal description of the desired behaviour. Both these features are lacking in software languages.

Patents documents US2006/230366 and US2006/230367 relate to the reduction of XOR/NOR and AND/OR subexpressions in structural design representations, respectively. They are both concerned with the problem of verifying designs of digital circuits in order to make them error-free and flaw-free. The inventions disclose structural rewriting techniques that reform the logic of a netlist and eliminate redundancy. The disclosed systems read a body of code, process it internally and produce an entire new body of code from the internal representation.

Consequently, there is a need for a tool and method for the automated refactoring of hardware design language code.

Papers "Architecture Refinements by Code Refactoring of Behavioral VHDL-AMS Models" (Zeng et al., *Proc. Int'l Symposium on Circuits and Systems ISCAS*2006, May 2006, pp. 1475-1478) and "RAMS: A VHDL-AMS Code Refactoring Tool Supporting High Level Analog Synthesis" (Zeng et al., Proc. IEEE Computer Society Annual Symposium on VLSI, May 2005, pp. 266-257) refer to a tool for automatically rewriting description of analog hardware, e.g. analog integrators, multipliers and adders. This tool is not used for rewriting descriptions of digital hardware. The tool rewrites entire compilation units, rather than making local modifications to a body of text. This implies there is no textual similarity between the original text and the generated text.

The paper "*A SystemVerilog Rewriting system for RTL Abstraction with Pentium Case Study*" (Haynal et al., ACM/IEEE Intl Conference on Formal Methods and Models for Co-Design, Memocode 2008, pp. 79-88) describes a tool with capabilities for localized refactoring of hardware descriptions in the Verilog language. Since this tool operates on netlist representations, it is restricted to operations on the synthesizable subset of Verilog (see section 3.1 of the paper). This limitation means that automated code modifications are not possible for legal Verilog code that is meant only to be simulated. Important non-synthesizable code includes: test benches, behavioral models and assertions. Code containing syntax errors (such as missing colons at the end of a statement) or semantic errors (such as using a signal that was not previously declared) is certainly not synthesizable and cannot be processed by the described tools. The errors referred to in section 2 of the paper are merely behavioral errors: the code will correctly compile and synthesize to hardware, but the behavior of the hardware will be incorrect.

The solutions described by Zeng and Haynal operate on single compilation units (i.e. files). This means that each modification applies only to a single hardware component. Modifications of a global scope (across multiple files) are not covered. Useful global modifications include (a) adding new connections (wires) between hardware components or (b) modifications to constants or datatypes that are used in several components.

AIMS OF THE INVENTION

The present invention aims to provide a tool and method for automatically rewriting HDL code.

SUMMARY

The present invention relates to a tool for rewriting hardware design language (HDL) code. The tool is arranged for receiving HDL code expressing a hardware design of a digital circuit. The tool comprises means for generating a representation of the syntax of the received HDL code, said representation containing a plurality of nodes. The tool further comprises means for determining modifications to the representation of the syntax whereby at least one node is added to or removed from the representation. The tool further comprises computation means for generating a modified version of the received HDL code taking into account the modifications to the representation of the syntax. The computation means is thereby arranged for determining modifications to the received HDL code from the modifications to the representation of the syntax and for generating the modified version using the received HDL code and the modifications to the received HDL code.

In a preferred embodiment the computation means is arranged for determining modifications to the received HDL code from the modifications to the representation of the syntax and for generating the modified version using the received HDL code and the modifications to the received HDL code.

Optionally the received HDL code is comprised in a plurality of files.

Advantageously the received HDL code is in the VHDL, Verilog, SystemC, SystemVerilog Handle C or MyHDL language.

The means for generating a representation preferably comprises a mechanism for recovering a syntax error. This allows continuing the parsing process even after a syntax error has been encountered.

In a second aspect the invention relates to a user interface for use with a tool for rewriting HDL code as previously described. The user interface is arranged for being fed with information related to a refactoring operation, said information comprising at least one string identifying at least one element in the received HDL code. The user interface comprises means for interpreting the at least one string and means for linking the at least one interpreted string to a node of a representation of the syntax of the HDL code.

The invention also relates to an assembly of the tool for rewriting HDL code as previously described and the user interface as previously described.

The invention also relates to an assembly comprising the tool for rewriting HDL code as above described and a graphical user interface for presenting information related to the representation of the syntax of the HDL code.

In a further aspect the invention relates to a method for rewriting hardware design language (HDL) code. The method comprises the steps of
- generating a representation of the syntax of a HDL code expressing a hardware design of a digital circuit, said representation comprising a plurality of nodes,
- determining modifications to the representation of the syntax whereby at least one node is added to or removed from the representation,
- determining modifications to said HDL code from said modifications to said representation of said syntax,
- generating a modified version of the HDL code using said HDL code and said modifications to said HDL code.

The step of generating a representation advantageously comprises converting the HDL code into an intermediate representation and subsequently parsing that intermediate representation.

In a preferred embodiment a set of concurrent statements in the HDL code form in the modified version an encapsulated entity. In another preferred embodiment a port is added in the modified version of the received HDL code.

DETAILED DESCRIPTION OF EMBODIMENT(S)

Figure 2:
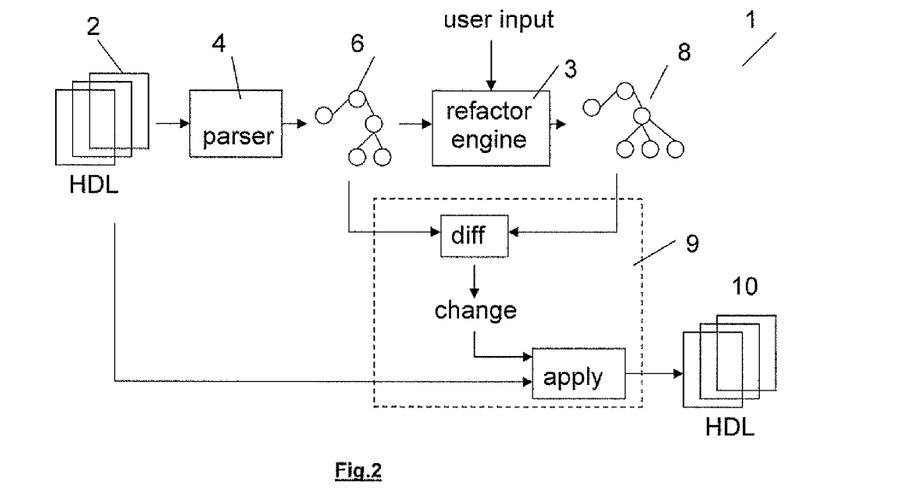
FIG. 2 illustrates a preferred embodiment of the tool according to the present invention.

The present invention relates to a tool capable of automatically refactoring HDL code. FIG. 2 represents a preferred embodiment of the invention. The core of the refactoring tool (1) is the refactoring engine (3). The tool receives as input (2) a digital hardware design, expressed in a HDL language. This design may contain one or several files of HDL code.

The input HDL code (2) is processed by a parser (4) suitable for the HDL language used, resulting in an abstract syntax tree (AST)(6). An abstract syntax tree is a tree representation of the syntax of source code. Each node of the tree denotes a construct, i.e. a syntactic element occurring in the source code. Such a syntactic element may for example be an assignment statement, a port binding or the name of a signal. The tree is abstract in the sense that it may not represent some constructs that appear in the original source. Commonly known compiler techniques can be used for translating text into a tree representation. For performing the task of automatically generating a parser for a given language a parser generator, like e.g. Lex and Yacc, JavaCC or ANTLR3 (see 'The definitive ANTLR Reference', Parr, 2007), is traditionally used. In the solution of this invention some specific additional features of state of the art compiler generators may advantageously be applied in the parser on top of the traditional state of the art techniques. These specific features are now described.

A suitable parser for implementing the invention incorporates a recovery mechanism, allowing to continue parsing even after a syntax error has been encountered (see e.g. "Efficient and comfortable error recovery in recursive descent parsers", J. Grosch, Structured Programming, 11(3), pp. 129-140, 1990). This allows refactoring hardware designs that contain errors, which is a useful feature because during the process of designing hardware, much of the time, the design is indeed containing errors. Often, designs converge to a valid state (without errors) only near the completion date.

The parser (4) translates the HDL text into an AST in two phases. In the first phase, the HDL text is converted into an intermediate tree representation of the syntax of the text. Next, this intermediate tree is parsed by a so-called 'tree walker' (as described in the above-mentioned Parr reference) and translated into a new abstract syntax tree (AST)(6), which contains a great deal of semantic high-level information about the original text. For instance, the AST can be queried to find all signals that are used (read or written) in a certain portion of the HDL text.

The refactoring tool of the invention optionally contains a traditional Graphical User Interface (GUI), as can be found in modern integrated development environments. Information from the AST can be presented to the user in that GUI. This information can include e.g. a short outline of a single file, a hierarchical view of the entire hardware design, the textual representation of the HDL file with extra colouring and markers or other forms of representation.

The user can initiate a refactoring operation by selecting a refactoring command in the GUI. The GUI may, depending on the specific refactoring command that is selected, present a dialog to request additional information about the refactoring to be performed.

Alternatively, the user initiates the refactoring operation by running a script, thereby employing a second user interface, namely a scripting interface as described more in detail below.

Depending on the selected refactoring, the refactoring engine (3) modifies the AST (6) by adding and/or removing one or more nodes to it, resulting in a modified AST (8). Based on the modifications to the AST, the refactoring engine computes textual changes, which can be additions, removals or modifications to the original text. The new contents of files are computed by applying the computed changes to the original files.

Optionally, the tool can show the proposed changes in the GUI and ask the user to confirm the changes.

In a final step the original files are replaced by newly computed files.

As already mentioned, the refactoring tool of the invention may also contain a scripting interface. Using this interface, a user can provide a script, which provides parameters for a refactoring action and which triggers the action. In the object-oriented scripting interface for refactoring according to the invention, HDL identifiers can be used as if they were identifiers in the scripting language. More specifically, an HDL object can be accessed in the scripting language, as if it were a field of a scripting object. The traditional way of accessing a field of an object in an object-oriented scripting language is as follows: object.field. Accessing a field not previously defined in a scripting language usually results either in an exception or in a null value being returned.

In the scripting language used in the scripting interface of the invention, certain objects have virtual fields that correspond to HDL identifiers. This is accomplished as follows. When trying to read a field with a name (say fieldName) of an object, the interpreter performs the following actions for resolving the name of the object:
  1. if the object has a real field with the given field name, return that field.
  2. if the object has a so-called getter-method getField-Name( ) call this method and return the result as virtual field.
  3. if the object is a collection, i.e. the object has a get (Object) method, try to look up the virtual field by invoking object.get("fieldName"). If this invocation returns an object, return this object as the virtual field.
  4, perform some look-up which is specific for the given object, and return the result as virtual field.

The refactoring tool of the invention provides methods of the second and third kind in the preceding list of actions, so that the user can identify HDL objects in a natural fashion in the scripting language, without the need for explicitly calling methods. As an example, the following entity in HDL is considered:

```
entity foo is
port (
    a: in bit;
    b: out bit)
end entity foo;
```

The AST node for the entity can be queried as follows to obtain the AST node for port "a":
  def a=foo.ports.a
For evaluating the above expression, the interpreter first calls method getPorts( ) of the AST node representing entity foo. This method returns a collection of ports (in this particular case the collection contains port "a" and port "b"). Next, the interpreter calls the method get("a") on the collection of ports. This method returns the AST node of port "a".

In the following paragraphs a number of examples of refactoring operations are discussed. The various examples illustrate possible ways to perform the computation of textual changes.

A. Encapsulation in a New Entity

One or more concurrent statements in the HDL code can be encapsulated in a new entity. An entity is a reusable body of HDL code and has a well-defined interface of generic parameters and ports. The new entity is automatically generated and instantiated in place of the original concurrent statements. The tool according to the invention automatically determines which ports are required for the new entity and determines the direction (in, out or in/out) and the datatype of the ports. If named constant values (constant or generic values) are used in the concurrent statements, these values are passed to the new entity as generic parameters. After an encapsulation operation the entire design remains consistent and the behaviour is unchanged.

A special mapping table is used to perform the transformation's bookkeeping. The mapping table is used as a central information system for the encapsulation, representing information about the actual values ('actuals') and formal values ('formals') of the instantiations. Formal values represent the names of ports or generic parameters of an entity. Actual values represent the signals (or constants) that are connected to formals. Both actuals and formals may contain conversion functions that convert the datatype of a formal to the datatype of an actual (or vice versa).

Each entry in the mapping table contains five values:
  Actuals, i.e. the signal, constant, . . . used in the original architecture
  Internal Formals: the ports/generics of encapsulate instantiations or virtual ports/generics for signals and constants (to add a direction in or out)
  Internal Connection: if a formal is read inside the new entity an extra connection is needed internally
  New Formal: the new formal to add to the new entity
  Statement: a link with the original concurrent statement is necessary to update mappings.

Figure 3:
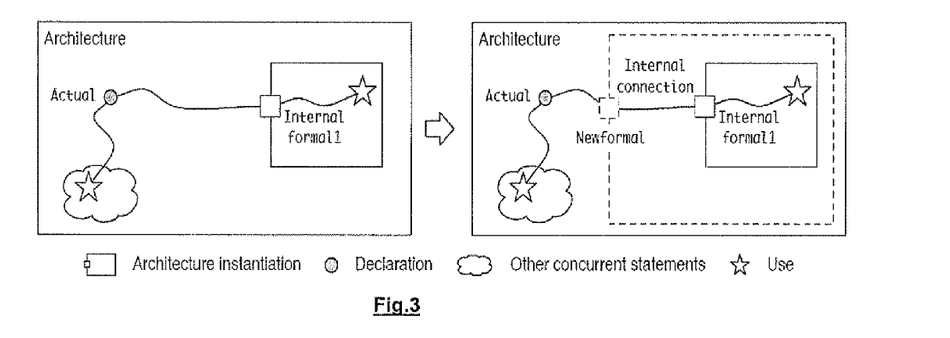
FIG. 3 illustrates a simple encapsulation in a new entity.
Figure 4:
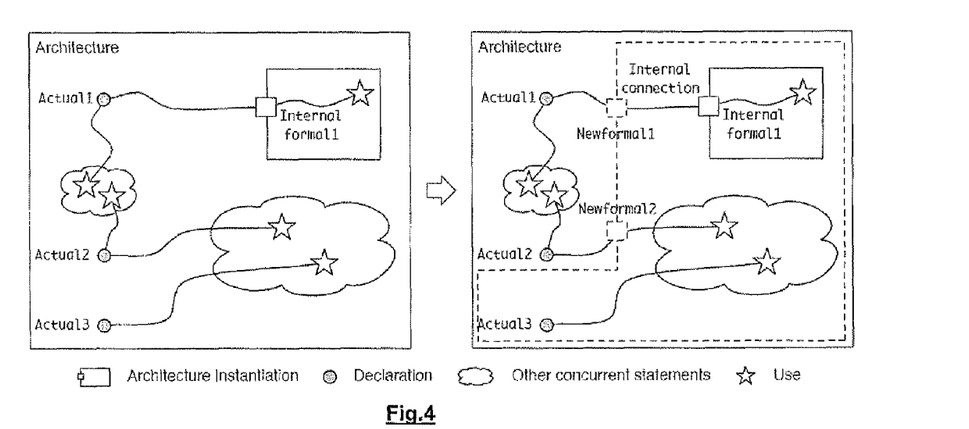
FIG. 4 illustrates a more complex encapsulation refactoring.

FIG. 3 illustrates the use of a mapping table. The use of the actual in a non-encapsulated concurrent statement is necessary to avoid that the actual becomes an internal signal. FIG. 4 shows a larger example wherein internal signals occur.

As optional conversion functions in port mappings are incorporated inside formal objects, they are automatically handled by the encapsulation refactoring. In an implementation according to the invention the conversion function is always pushed to the outermost entity instantiation.

B. Adding a Port

Sometimes the interface of an entity with the rest of the code needs to be changed. Ports may need to be added or removed, or the order may need to be changed. Adding or removing ports has a physical impact on the digital design. Changing the order of ports has the effect of making a design more intelligible by the human reader, thus increasing his productivity.

Below a representation in pseudo-code is given.

```
addPort(entity, portName, dataType, openOrStubValue, direction){
    def change = new Change( )
    assert(portName is valid identifier)
    assert(portName is not yet used in entity)
    assert(dataType is valid)
    // modify entity definition: add port to entity itself
    newEntity = entity.clone( )
    newEntity.addPort(new Port(portName,dataType, direction))
    subChange = replacementChange(entity,newEntity)
    change.add(subChange)
    // modify all redeclarations of entity: add port to component declarations
    for(declaration : lookupRedeclarationsOf(entity)){
        newDeclaration = declaration.clone( )
        newDeclaration.addPort(new Port(portName,dataType, direction))
        subChange = replacementChange(declaration, newDeclaration)
        change.add(subChange)
    }
    // modify all instantiations: add port to instantiations
    // output ports are left open, input ports are stubbed
    def instantiations = lookupInstantiationsOf(entity)
    for(instantiation : instantiations){
        newInstantiation = instantiation.clone( )
        newInstantiation.getPortMap( ).map(portName,openOrStubValue)
        subChange = replacementChange(instantiation, newInstantiation)
        change.add(subChange)
    }
    return change
}
```

In this algorithm, the functions addPort(x) and portMap.map (x,y) add nodes to the AST. As an example, an entity and a simplified form of its AST before and after adding a port is included

```
*) VHDL before:
    entity foo is
        port (
            a : in bit;
            b: out bit)
    end entity foo;
*) AST before (notation of the ANTLR Reference book; each word designates exactly one node)
    ^( ENTITY foo
        ^( PORTS
            ^( PORT a in bit )
            ^( PORT b out bit )
        )
    )
*) AST after
    ^( ENTITY foo
        ^( PORTS
            ^( PORT a in bit )
            ^( PORT b out bit )
            ^( PORT c out bit )
        )
    )
*) VHDL after:
    entity foo is
        port (
            a : in bit;
            b: out bit;
            c: out bit)
    end entity foo;
```

The algorithm for 'deletePort' is trivially derived from the algorithm of 'addPort'. Mappings of the deleted ports in instantiations are simply removed, without the need for stub values.

C. Connect Instance

Figure 5:
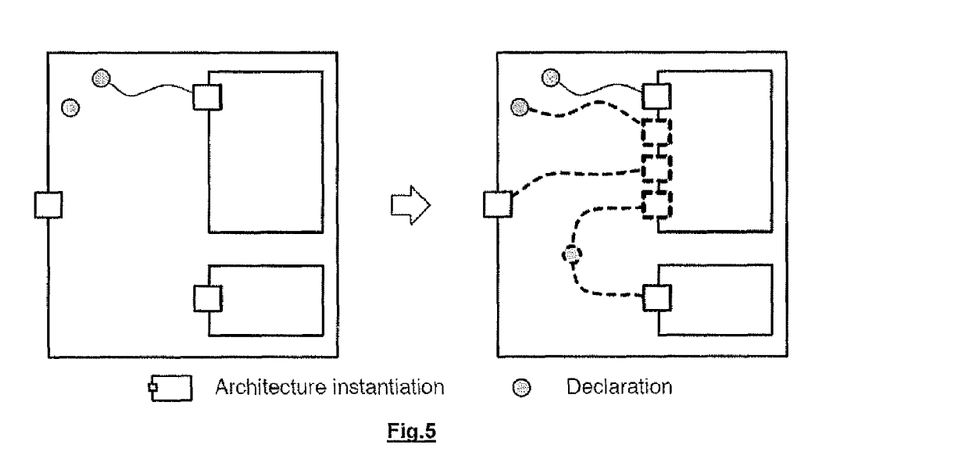
FIG. 5 illustrates a 'Connect instance' refactoring.

Sometimes, an internally instantiated entity needs to be connected to an outside data signal. This outside data signal can be:

1. a signal, visible in the same hierarchy level as the instantiated entity
2. a port of another instantiated entity, instantiated in the same hierarchy level
3. a port of the entity that encloses the instantiated entity This is a spatial refactoring, since one spatial entity is physically connected to a signal outside the entity. FIG. 5 provides an illustration.

The user selects, e.g. via the GUI, an entity instantiation and then selects the action "Connect instance". Next, he chooses a data signal from a list provided by the tool. When performing the refactoring, a new port is added to the instantiated entity, with the correct datatype and direction, and a sensible name. In the entity instantiation statement this new port is connected to the correct data signal. In the case of connecting to an entity in the same hierarchy level, the tool needs to generate a new signal that connects the two ports. After a connect instance operation the entire design remains consistent and the behaviour is unchanged.

D. Correcting Problems

Strictly speaking, refactoring does not change functionality. However, as a refactoring tool has all the knowledge of the design code, it is natural to go a step further. The tool can help to detect and correct problems and to make changes in a controlled way. It can thus assist the developer.

Hardware development languages can express purely combinational hardware, i.e. hardware having no internal state, but for which the values of the output signals solely depend on the input signal values. To express such combinational hardware as a process in a HDL, at least two conditions must be met. All signals read in that process must be enumerated in the process' sensitivity list. The sensitivity list is a list of signals to which a process is sensitive, i.e. each time one of these signals changes, the process is executed in the simulator. As a second condition all signals written at any place in the process, must be guaranteed to be written in each execution of the process. If one of the conditions is not met, the process is not combinational, but describes a 'latch', which does have an internal state. More often than not, this is a programming error.

Examples of non-combinational processes are the following.

```
process(a,b) -- signal c is lacking from sensitivity list
begin
    x<=a+b+c; -- signals a,b and c are read
end
and
process(a,b) -- sensitivity list is correct
begin
    if b>=5 then
        x<=a; -- x is only written when b>=5
    end if
    -- x is not written when (b < 5)
end
```

Automatically correcting these programming errors has a direct impact on the correctness of hardware simulation and on the hardware generated from the HDL code. Especially in large processes with many signals, it is not trivial for the human designer to spot this type of error or to correct it.

An error in the sensitivity list can be fixed with an algorithm expressed in pseudocode as shown below.

```
fixSensitivityList(process){
    def sensitivitySet = new Set( )
    // add all signals that are read anywhere in the process
    for(statement: process.getStatements( )){
        sensitivitySet.add(statement.getSignalsRead( ))
    }
    sensitivityList = sort(sensitivitySet)
    def newProcess = process.clone( )
    def change = newProcess.replaceSensitivityList(sensitivityList)
    return change
}
```

In this algorithm, the function newProcess.replaceSensitivityList( ) first removes zero or more nodes and later adds zero or more nodes to the AST. This algorithm turns a piece of code that before looked like

```
process(a)
begin
    x <= a+b;
end
``` into the following piece of code:

```
process(a,b)
begin
    x <= a+b;
end
```

In the case of this example, a single node ("a") is first removed, and two nodes ("a" and "b") are later added to the AST.

After correcting the sensitivity list, the behaviour of the design is changed, presumably improved. It is to be noted that a similar operation is already implemented in the VHDL-mode for Emacs. However, that tool uses string matching to guess the correct sensitivity list, whereas in this invention a full parser is used to determine the exact meaning of the VHDL text.

Fixing an error as in the second example above (see [0047]) can be done by providing default values for combinational hardware. This refactoring modifies a process in HDL, so that each signal that can be assigned in the process is guaranteed to be assigned in that process. This is accomplished by assigning a sensible default value to it at the beginning of the process.

E. Providing Default Values for Synchronous Hardware

A synchronous piece of hardware only changes its output values when its clock signal value changes. This can happen when the clock changes from high to low (falling clock edge), from low to high (rising clock edge) or both.

One exception to this rule is that the output signals may change—even if the clock does not change—when an asynchronous reset signal is activated. When the reset is activated, all output values are typically set to a predetermined known value. In a synchronous process, it is common that each value that is assigned in the synchronous part, be assigned a value (the reset value) when the reset is active. Failing to do so results in undefined values of the relevant signals and possibly in unpredictable hardware behaviour. It is often considered a bug when signals are not assigned a value upon reset.

An example is the following:

```
process(clock,reset) -- sensitivity list is correct
begin
    if reset='0' then -- asynchronous, active-low reset
        -- All signals that are assigned in the synchronous part or the
        process
        -- should be assigned a "reset value" here.
        a <= '0';
        b <= '0';
    elsif rising_edge(clock) then
        -- synchronous part
        a <= not b;
        b <= c or d;
    end if;
end
```

It is a time consuming and error-prone task for the human designer to verify that each signal assigned in the synchronous part of a process is also reset in the reset clause of that process. An automated refactoring saves time and eliminates the risk of this type of errors. The automated refactoring changes the behaviour of the hardware generated from the HDL code. The following algorithm (in pseudocode) can do this job.

```
provideDefaultValueForSynchronous(process){
    def change = new Change( )
    def resetClause = lookupResetClauseFor(process)
    def synchronousPart = lookupSynchronousPartFor(process)
    def signalsWrittenInSynchronousPart =
    synchronousPart.signalsWritten( )
    def signalsWrittenInRestClause = resetClause.signalsWritten( )
    for(signal: signalsWrittenInSynchronousPart){
        if(not signalsWrittenInRestClause.contains(signal)){
            def defaultValue = lookupDefaultValue(signal.getDatatype)
```

```
            assignment =
            new AssignmentStatement(siganal,defaultValue)
            statementChange =
            process.addStatementAtBeginning(assignment)
            change.add(statementChange)
         }
      }
      return change
}
```

In this algorithm, the function process.addStatementAtBeginning(x) adds one or more nodes to the AST. The added nodes represent a statement in HDL.

Although the present invention has been illustrated by reference to specific embodiments, it will be apparent to those skilled in the art that the invention is not limited to the details of the foregoing illustrative embodiments, and that the present invention may be embodied with various changes and modifications without departing from the spirit and scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the spirit and scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", "third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A computer tool for rewriting hardware design language, HDL, code, wherein:
said tool is arranged for receiving an original version of a HDL code expressing a hardware design of a digital circuit and comprising means for generating a representation of the syntax of said received original version of the HDL code, said representation containing a plurality of nodes, said tool further comprising:
means for determining modifications to said representation of said syntax whereby at least one node is added to or removed from said representation, and
computation means for generating a modified HDL code by computing a set of textual changes according to said modifications to said representation of said syntax, and applying said textual changes to said original version of said received HDL code.

2. The tool for rewriting HDL code according to claim 1, wherein said received HDL code is contained in a plurality of files.

3. The tool for rewriting HDL code according to claim 1, wherein said received HDL code is in the VHDL, Verilog, SystemC, SystemVerilog Handle C or MyHDL language.

4. The tool for rewriting HDL code according to claim 1, wherein said means for generating a representation comprises a mechanism for recovering a syntax error.

5. The tool for rewriting HDL code according to claim 1, further comprising user interface arranged to be fed with information related to a refactoring operation, said information comprising at least one string identifying at least one element in the HDL code to be rewritten, said user interface comprising means for interpreting said at least one string and means for linking said at least one interpreted string to a node of a representation of the syntax of said HDL code.

6. The tool for rewriting HDL code according to claim 1, further comprising a graphical user interface for presenting information related to said representation of said syntax of said HDL code.

7. A computer method for rewriting hardware design language, HDL, code comprising the steps of:
in a computer processor, receiving an original version of a HDL code expressing a hardware design of a digital circuit, and generating a representation of the syntax of the original version of the HDL code, said representation comprising a plurality of nodes;
in said computer processor, determining modifications to said representation of said syntax, whereby at least one node is added to or removed from said representation;
in said computer processor, determining a set of textual modifications to original version of said HDL code from said modifications to said representation of said syntax; and
in said computer processor, generating a modified version of said HDL code by applying said textual changes to said original version of said HDL code.

8. The computer method for rewriting hardware design language code according to claim 7, wherein said step of generating a representation comprises converting said HDL code into an intermediate representation and subsequently parsing said intermediate representation.

9. The computer method for rewriting hardware design language code according to claim 7, wherein a set of concurrent statements in said HDL code form in said modified version an encapsulated entity.

10. The computer method for rewriting hardware design language code according to claim 7, wherein a port is added in said modified version of said received HDL code.

* * * * *